United States Patent [19]

Yamada

[11] Patent Number: 5,672,977

[45] Date of Patent: Sep. 30, 1997

[54] PROBE APPARATUS

[75] Inventor: Masayuki Yamada, Nirasaki, Japan

[73] Assignees: Tokyo Electron Limited, Tokyo; Tokyo Electron Yamanashi Limited, Nirasaki, both of Japan

[21] Appl. No.: 514,384

[22] Filed: Aug. 11, 1995

[30] Foreign Application Priority Data

Sep. 9, 1994 [JP] Japan .................................. 6-215869

[51] Int. Cl.⁶ ..................................... G01R 31/02
[52] U.S. Cl. ............................. 324/754; 324/757
[58] Field of Search ........................ 324/754–769

[56] References Cited

U.S. PATENT DOCUMENTS

| | | | |
|---|---|---|---|
| 4,906,920 | 3/1990 | Huff et al. | 324/754 |
| 5,180,977 | 1/1993 | Huff | 324/754 |
| 5,416,429 | 5/1995 | McQuade et al. | 324/762 |
| 5,461,326 | 10/1995 | Woith et al. | 324/758 |

FOREIGN PATENT DOCUMENTS

| | | |
|---|---|---|
| 0 294 939 | 12/1988 | European Pat. Off. . |
| 0 613 013 | 8/1994 | European Pat. Off. . |
| 2-126159 | 5/1990 | Japan . |
| 2-163664 | 6/1990 | Japan . |

*Primary Examiner*—Ernest F. Karlsen
*Assistant Examiner*—Russell M. Kobert
*Attorney, Agent, or Firm*—Oblon, Spivak, McClelland, Maier & Neustadt, P.C.

[57] ABSTRACT

The probe apparatus for a semiconductor wafer has a work table on which a wafer is placed. A printed wiring board having a high rigidity is situated above the work table. A support block is mounted on the printed wiring board so as to pierce through its opening. The support block has a recess which opposes to the work table, and a flexible membrane-like probe card is detachably mounted on the support block so as to cover the recess. The probe card has a main region in which contact elements to be brought into contact with electrode pads of the semiconductor wafer are arranged. A rigid rectangular frame is attached to the rear surface of the probe card so as to surround the main region, thus imparting a flatness to the probe card. A pusher is provided in the recess of the support block so as to be brought into contact with the rear side of the main region of the probe card. The pusher is swingably arranged on the lower end of the shaft vertically supported. The shaft is supported by the support block via two belleville springs.

17 Claims, 5 Drawing Sheets

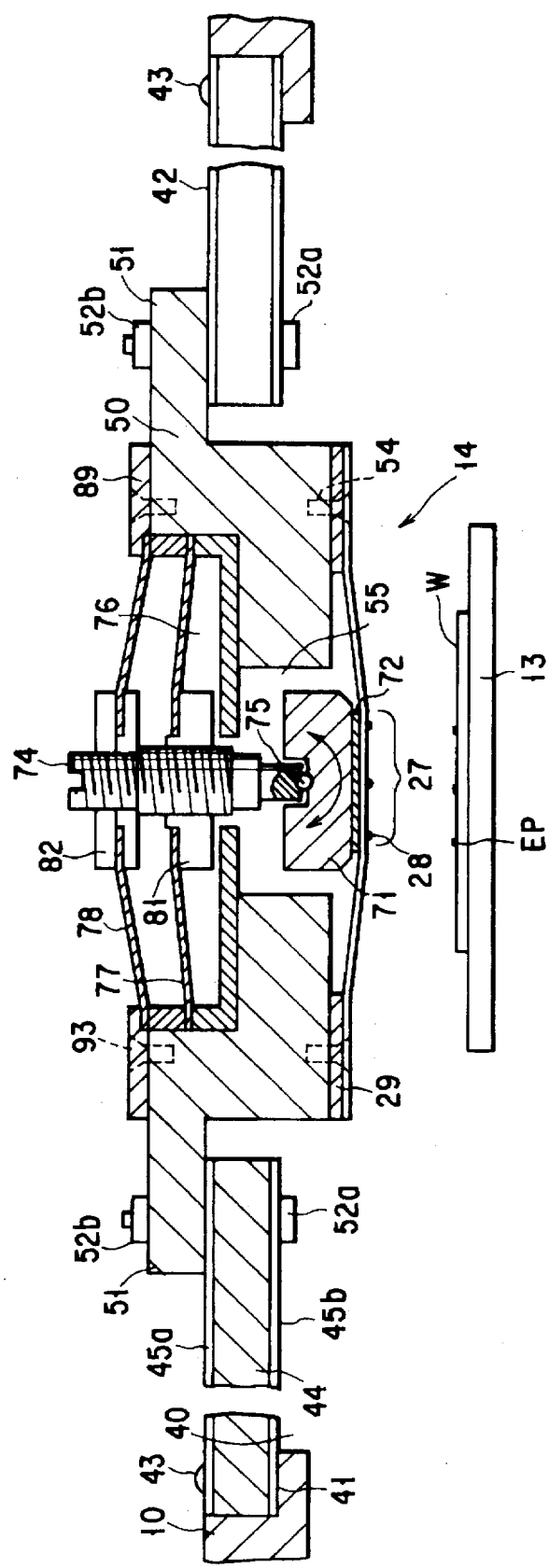
F I G. 4

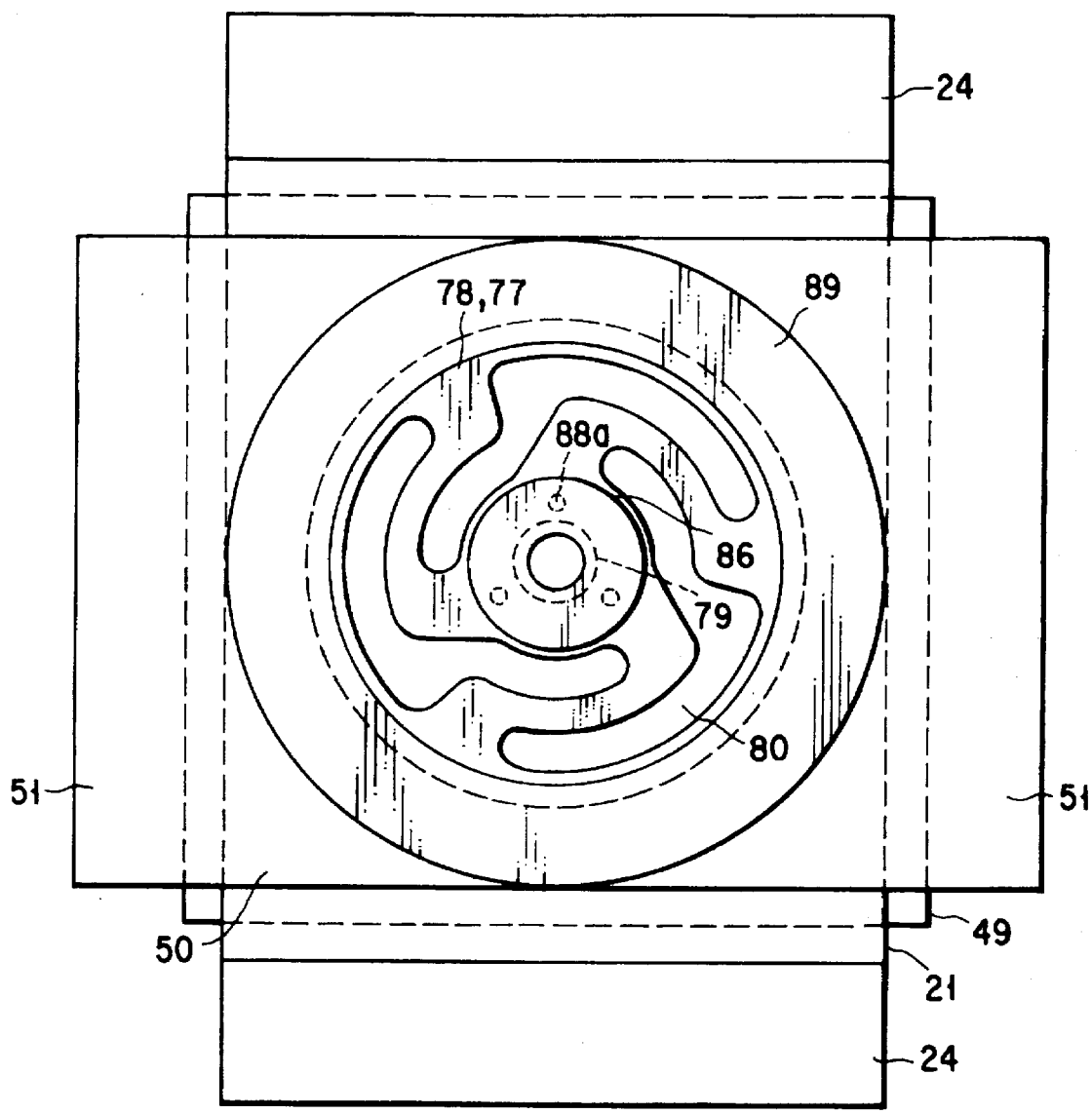
F I G. 5

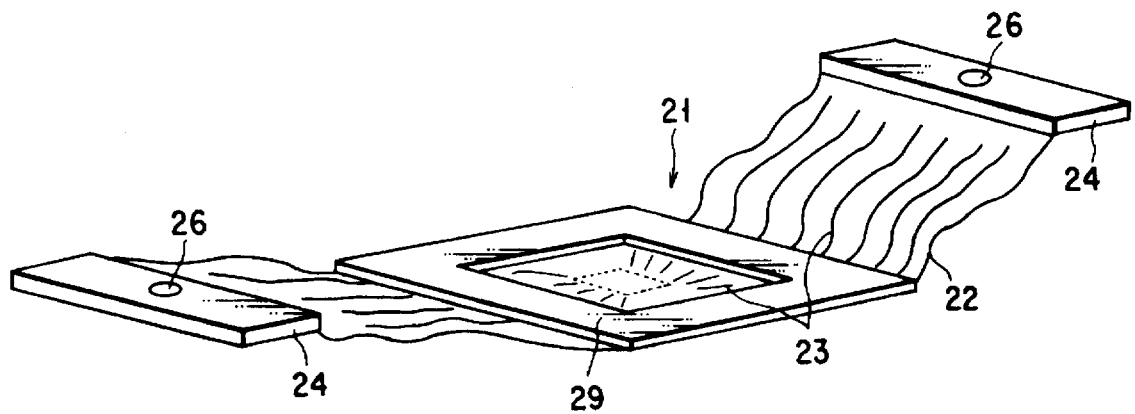
F I G. 6
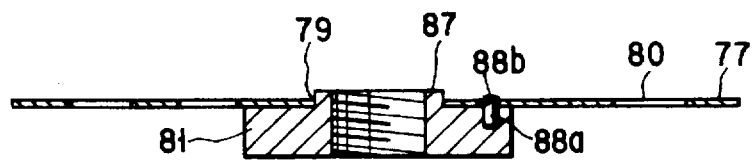
F I G. 7

PROBE APPARATUS

BACKGROUND OF THE INVENTION

1. Field of the Invention

The present invention relates to a probe apparatus for examining an electrical characteristic of an object such as a semiconductor device.

2. Description of the Related Art

As conventionally known, a large number of semiconductor devices are formed on a semiconductor wafer by using the precision photographic transfer technique or the like, and then the wafer is diced into the semiconductor devices. In such a manufacture process of semiconductor devices, the electrical characteristics of semi-finish semiconductor devices are examined while they are still in a semiconductor wafer by using a probe apparatus. Then, only those of the semi-finished semiconductor devices judged to be good in the examination are passed onto later steps including packaging, thereby increasing the productivity.

A probe apparatus of this type includes a work table movable in the X-Y-Z-θ directions, on which an object is placed. A probe card having a number of probes each corresponding to each one of electrode pads of a semiconductor wafer as an object of examination, is fixedly situated above the work table. The semiconductor wafer is placed on the work table, and the work table is driven such as to bring each probe into contact with the respective electrode pad of the semiconductor wafer, thus performing an examination via each probe by using a tester.

Recently, in accordance with a further decrease in the size of semiconductor devices, the integration of circuits is greatly increased. Accordingly, the size of electrode pads is reduced, and the interval between adjacent electrode pads is narrowed. For example, each electrode pad of a semiconductor device has one side of 60 μm to 100 μm, and the distance between adjacent electrode pads in a row is 100 μm to 200 μm. Therefore, as mentioned above, it is technically very difficult to arrange a large number of, for example, several hundred probes within a limited space of a probe card, and the conventional arrangement of probes is now reaching its limit.

In consideration of this, a so-called membrane-type probe card, in which a number of electrode bumps are provided on a membrane having wiring of a predetermined pattern, is proposed as disclosed in Jap. Pat. Appln. KOKAI Publication No. 2-126159 or 2-163664.

The probe apparatus disclosed in Jap. Pat. Appln. KOKAI Publication No. 2-126159 has a membrane having a number of electrode bumps and adhered to a movable ring frame. The periphery portion of the membrane is supported by a support, and a plate spring is stretched between the support and the movable ring frame. A cushion is adhered to the rear surface of the membrane, and the difference in height between electrode pads of a wafer is absorbed by the cushion. During the examination, the membrane moves in the vertical direction integrally with the movable ring frame in spite of the spring force of the plate spring, and the electrode bumps are brought into elastic contact with the electrode pads.

The probe apparatus disclosed in Jap. Pat. Appln. KOKAI Publication No. 2-163664 has substantially the same structure as that of the Publication No. 2-126159 except that a swingable plate is provided on the rear surface of the membrane. In this apparatus, the membrane and the wafer are gradually set in parallel to each other and brought into elastic contact with each other as the swingable plate is rotated during the examination, when the wafer and the membrane have not been in parallel with each other.

SUMMARY OF THE INVENTION

The object of the present invention is to provide a probe apparatus suitable for the examination of semi-conductor devices having a high degree of integration, and capable of performing the measurement by accurately bringing the contact electrodes in contact with the electrode pads of each device.

According to a first aspect of the present invention, there is provided a probe apparatus for examining an electrical characteristic of an object having a number of electrode pads, comprising: a work table having a table surface on which the object is placed; a wiring board provided above the work table, the wiring board comprising a substrate supported by a framework of the probe apparatus and having a high rigidity, and board wiring provided on the substrate and electrically connected to a tester; a probe card supported by the wiring board, the probe card comprising a flexible and insulating membrane, and flexible card wiring formed on the membrane and electrically connected to the board wiring of the wiring board, the probe card having a main region, in which a plurality of contact elements to be respectively brought into contact with the electrode pads of the object are arranged on a front side opposing to the table surface, and the contact elements being electrically connected to the card wiring; mounting means for mounting the probe card on the wiring board; a pusher brought into contact with a rear side of the main region of the probe card, the pusher having a contact surface set such that all of the contact elements are located within a contour thereof, a shaft engaging with the pusher so as to arrange the pusher swingably on a rear side of the main region of the probe card; a belleville spring connected to the shaft so as to apply an urging force to the main region of the probe card, to the contact surface of the pusher; and means, mounted on the wiring board, for securing the belleville spring.

According to a second aspect of the present invention, there is provided a probe apparatus for examining an electrical characteristic of an object having a number of electrode pads, comprising: a work table having a table surface on which the object is placed; a wiring board provided above the work table, the wiring board comprising a substrate supported by a framework of the probe apparatus and having a high rigidity, and board wiring provided on the substrate and electrically connected to a tester; a support block supported by the wiring board, the support block having a recess arranged such as to oppose to the table surface; first mounting means for mounting the support block to the wiring board; a probe card supported by the support block, the probe card comprising a flexible and insulating membrane, and flexible card wiring formed on the membrane and electrically connected to the board wiring of the wiring board, the probe card having a main region, in which a plurality of contact elements to be respectively brought into contact with the electrode pads of the object are arranged on a front side opposing to the table surface, the contact elements being electrically connected to the card wiring, and the main region being located so as to cover the recess of the support block; second mounting means for mounting the probe card on the support block; a pusher arranged in the recess of the support block so as to be brought into contact with a rear side of the main region of the probe card, the pusher having a contact surface set such that all of the contact elements are located within a contour thereof, a shaft engaging with the pusher so as to arrange the pusher swingably on a rear side of the main region of the probe card; a belleville spring connected to the shaft so as to apply an urging force to the main region of the probe card, to the contact surface of the pusher; and means, mounted on the support block, for securing the belleville spring.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4 is another cross sectional view showing the probe mechanism of the probe apparatus shown in FIG. 1 in the direction normal to the cross section shown in FIG. 3;

FIG. 5 is a diagram briefly showing a plan-view layout of the probe mechanism of the probe apparatus shown in FIG. 1;

FIG. 6 is a perspective view showing a probe card of the probe apparatus shown in FIG. 1; and FIG. 7 is a cross sectional view showing a state in which a belleville spring is mounted.

DETAILED DESCRIPTION OF THE PREFERRED EMBODIMENT

Figure 1:
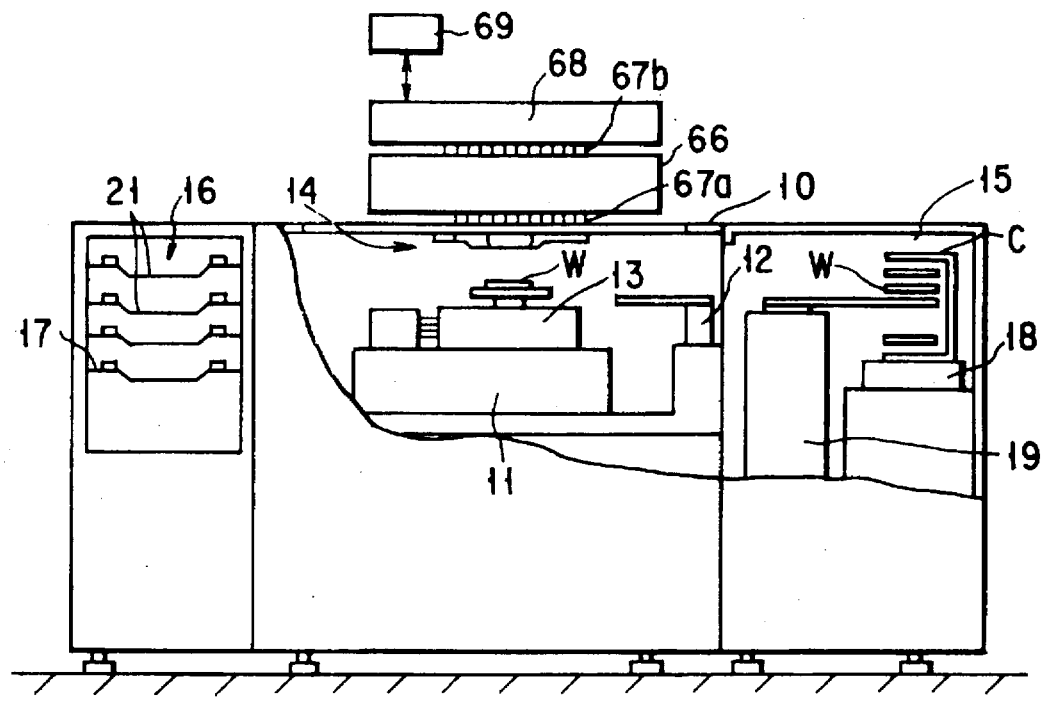
FIG. 1 is a diagram briefly showing the entire probe apparatus according to an embodiment of the present invention.

As shown in FIG. 1, a main body 10 of a probe apparatus has a main stage 11 in its center. A work table 13 having a horizontal top surface is provided on the main stage 11, and an object to be examined such as a semiconductor wafer W is placed on the top surface. The main stage 11 can be moved along with the work table 13 in the X and Y directions in a horizontal plane. A probe mechanism 14 is provided above the work stage 13. An alignment unit (not shown) is provided in the front side of the center of the main body 10. A camera serving as an image identifying device used for alignment is provided in the alignment unit. For the purpose of alignment, the work stage 13 is moved below the camera.

An autoloader 15 is provided on the right side of the main body 10. In the autoloader 15, a wafer cassette C containing a number of semiconductor wafers W arranged in a vertical direction at regular intervals, 10 is replaceably placed on a cassette table 18. Provided between the wafer cassette C and the work table 13, are a loader stage 19 movable in the horizontal plane and a wafer handling arm 12 driven by the Y directional driving mechanism and the Z direction elevating mechanism.

In order to examine a semiconductor wafer W using the probe apparatus, the wafer is conveyed close to the work table 13 by the loader stage 19, and then placed onto the work table 13 by the handling arm 12. After the examination, the wafer is transferred onto the loader stage 19 by the handling arm 12, and then conveyed to the wafer cassette C by the loader stage 19.

A probe card exchanger 16 is provided on the left side of the main body 10. In the probe card exchanger 16, different types of probe cards 21 are supported by card holders 17, and a number of cards are arranged therein in the vertical direction at regular intervals between adjacent ones.

A contact ring 66 and a test head 68 are detachably arranged on the probe mechanism 14. The contact ring 66 has conductive pins 67a and 67b which project upward and downward, respectively. The contact ring 66 is electrically connected to a printed wiring board 42 of the probe mechanism 14 via the pins 67a, and to a test head 68 via the pins 67b. The test head 68 is connected to a tester 69. The tester 69 applies a predetermined power voltage and an examination pulse signal to a chip of the semiconductor wafer W, and receives an output signal from the chip. Based on the received output signal, the tester 69 judges whether or not the chip is defective.

Figure 2:
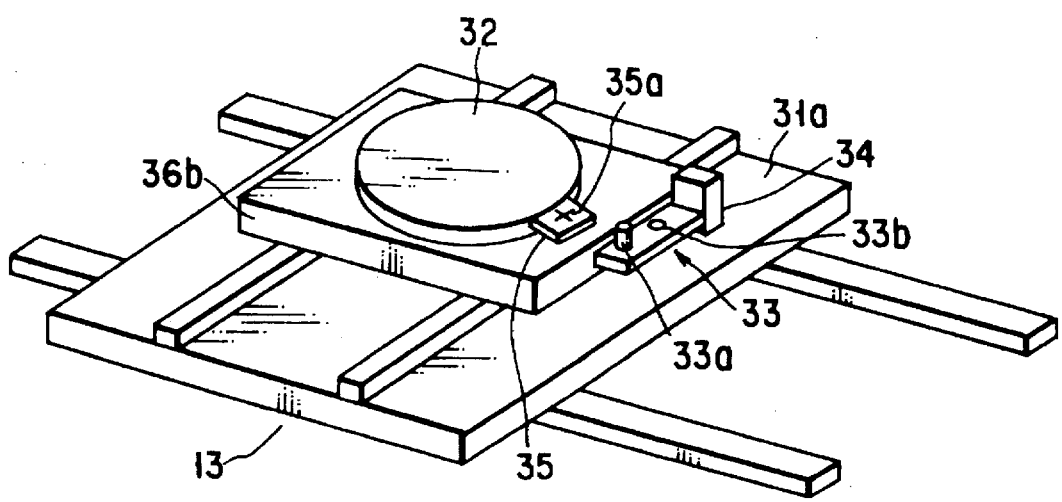
FIG. 2 is a perspective view showing the work table of the probe apparatus shown in FIG. 1.

Next, the work table 13 will be explained with reference to FIG. 2.

The work base 13 includes an Y stage 31a movable in the Y direction along two rails extending in the Y direction, and a X stage 31b movable on the Y stage 31a in the X direction along two rails extending in the X direction. The Y and X stages 31a and 31b are driven in the Y and X directions, respectively, in the horizontal plane by a generally-used driving mechanism which includes a pulse motor and the like. A chuck 32 mounted on the X stage 31b can be driven in the vertical direction (Z direction) by a known elevating mechanism, and rotated around the vertical center line which passes through the center of the X stage 31b, by a known rotation mechanism.

An elevating member 34 is fixed on a side surface of the X stage 31b. A camera 33 movable up and down is held on the elevating member 34. The movable camera 33 consists of a high-magnification system 33a and a low-magnification system 33b.

A small piece 35 is fixed on an side surface of the chuck 32 such that the small piece horizontally projects in its radial direction. The small piece 35 is formed of a rectangular transparent plate, on which a target 35a defined by the center of a cross drawn with a conductive thin film, for example, an ITO (indium tin oxide) or chrome thin film, is formed. The target 35a serves as a reference point for detecting positions in X, Y and Z directions by using the camera 33. Further, in the vicinity of the cross-shaped thin film, a conductive transparent thin film, for example, an ITO thin film, is provided to surround the cross-shaped thin film. The conductive transparent thin film is provided such that positions of a water W on the work table 13 with respect to the Z direction can be detected by an electrostatic capacity sensor (not shown).

The small piece 35 on which the target 35a is formed, can move onto the optical axis of the high-magnification system of the moving camera 33 as the chuck 32 rotates, and retreat therefrom. The small piece 35 may be detachably mounted on the chuck 32.

Next, the probe mechanism 14 will be described with reference to FIGS. 3 to 7.

An opening 40 is provided in an upper portion of the main body 10 such as to oppose to the main stage 11.

The opening 40 is defined by the inner periphery of the step portion 41, and the printed wiring board 42 is fixed onto the step portion 41 by screws 43 such as to block up the opening 40.

The printed wiring board 42 includes a glass cloth epoxy resin substrate 44 having high rigidity and mechanical strength, and printed wiring 45a and 45b formed on the upper and lower surfaces of the substrate. Connector sections 47, in which a plurality of electrode pads 46 are arranged, are formed on the wiring board 42 in a horizontally symmetrical manner with respect to the center thereof. Further, a mount hole 48 which is pierced through the wiring board 42 is formed in each connector section 47.

A plan-view rectangular opening 49 is formed in the center of the printed wiring board 42, and a plan-view rectangular support block 50 is supported by the wiring board 42 so as to project downward from the opening 49. The support block 50 is made of a material, such as stainless steel or aluminum, and having a high rigidity. The support block 50 comprises flanges 51 extending in the horizontal direction on the wiring board 42, as shown in FIGS. 4 and 5. Each of the flanges 51 and the wiring board 42 are integrally fixed to each other by a screw 52a inserted in through holes made in these members and a nut 52b.

The support block 50 has a plan-view rectangular recess 55 at its center. The probe card 21 is detachably mounted, such as to cover the recess 55, on the bottom surface of the support block 50 by screws 54.

Each probe card 21 includes a rectangular membrane 22 made of a flexible and insulating material such as polyimide resin or silicone resin, and a flexible printed circuit (FPC) 23 formed of copper, copper alloy or the like, on the membrane. Connector sections 24 having a number of electrode pads 25 connected to a print circuit 23 are provided on both ends of the membrane 22 in the longitudinal direction. A hand insulating resin plate having a through-hole 26 is adhered to each connector section 24.

A main region 27 in which a great number of contact elements 28 connected to the print circuit 23 and made of gold, gold-alloy or the like, is formed at the center of the lower surface of the membrane 22. The main region 27 is formed to have substantially the same size as that of one device of a semiconductor wafer W, that is, chip. The contact elements 28 are arranged such as to correspond to the electrode pads of the chip, and projects from the lower surface of the membrane 22.

A rectangular frame 29, made of a material such as an aluminum material and having a high rigidity, is adhered, as an integral unit, to that part of the upper surface of the membrane 22, which corresponds to the vicinity of the main region 27. The frame 29 is made flat and has a uniform thickness, thus giving a flatness to the main region 27 of the probe card 21 and the surrounding thereof. The frame 29 is detachably fixed onto the bottom surface of the supporting block 50 by the screws 54, and thereby the probe card 21 is positioned and supported with respect to the printed wiring board 42. The frame 29 may be positioned and fixed with respect to the support block 50 by vacuum suction or the like.

The bottom surface of the support block 50 is set horizontal, and therefore the main region 27 of the probe card 21 and the periphery thereof, surrounded by the frame 29 are positioned in parallel with the top surface of the work table 13 on which a wafer W is placed, in the state in which the frame 29 is fixed on the supporting block 50. Although the membrane 22 of the probe card 21 is made of flexible materials, and has a high flexibility overall, certain degrees of flatness and horizontal rigidity are imparted to the membrane by the frame 29. Further, the stretch and sag of the membrane are suppressed so that the pitch of the contact elements 28 is maintained.

Figure 3:
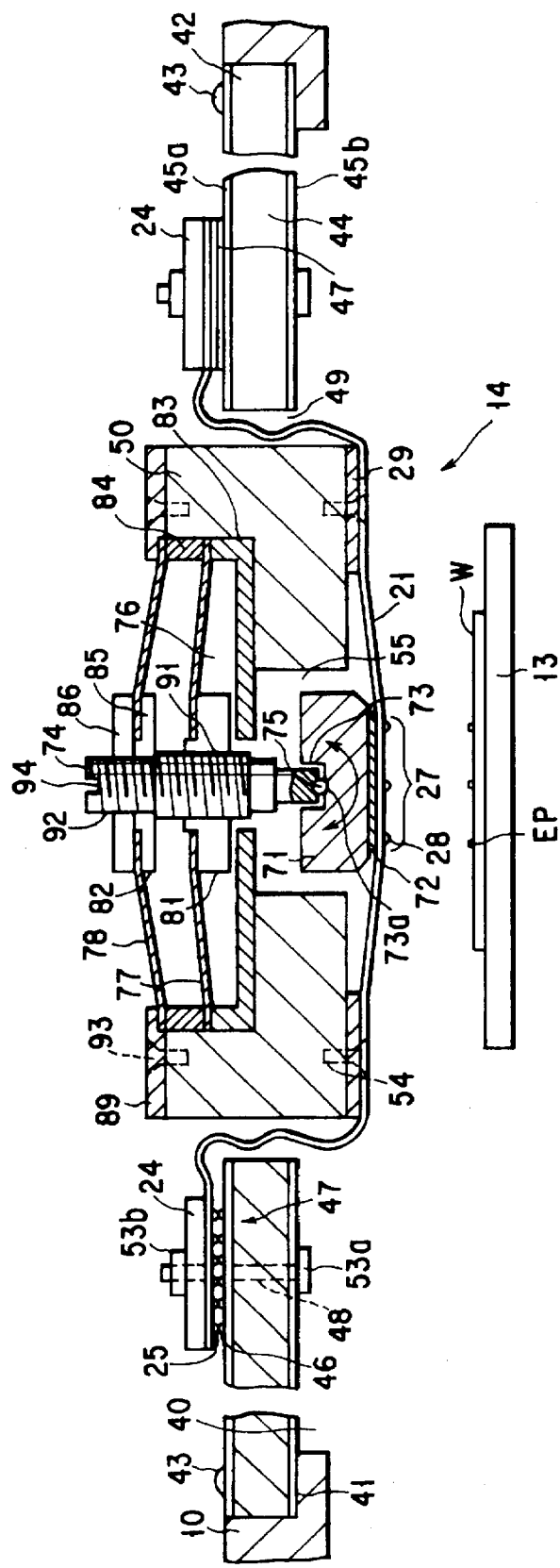
FIG. 3 is a cross sectional view showing the probe mechanism of the probe apparatus shown in FIG. 1.

As shown in FIGS. 3 and 5, the connector sections 24 at both ends of the probe card 21 are arranged in the direction normal to the flange 51 of the support block 50. Between the main region 27 and each connector portion 24, the probe card 21 passes through the gap confined by the support block 50 and the wiring board 42, made in the opening 49 of the wiring board 42. The connector sections 24 of the probe card 21 and the connector sections 47 of the printed wiring board 42 are positioned such that the electrode pads 25 and the electrode pads 46 are brought into contact with each other. Consequently, the printed wiring board 42 and the probe card 21 are electrically connected to each other. Further, screws 53a are inserted from below into the through-holes 26 of the connector sections 24 and the mount holes 48 of the printed wiring board 42, and the screws 53a are tightened by nuts 53b on the top surface side of the printed wiring board 42, thus fixing the connector sections 24 of the probe card 21 to the printed wiring board 42.

With the above operation, the probe card 21 is electrically and mechanically connected to the printed wiring board 42, and the middle portion of the probe card 21 projects downward from the printed wiring board 42 due to the support block 50. It is important that the main region 27 of the probe card 21 is maintained in parallel with the semiconductor wafer w placed on the work table 13. In the apparatus of this embodiment, the probe card 21 can be provided with reference to the lower surface of the printed wiring board 42 due to the frame 29, and therefore the parallelism between the main region 27 and the semiconductor wafer W can be easily and accurately maintained.

A pusher 71 made of a rigid material, for example, the same metal material as that of the supporting block 50, is provided in the recess 55 of the support block 50 and behind the main region 27 of the probe card 21. The pusher 71 has a plan-view rectangular shape similar to that of the recess 55. In the recess 55, such a gap that the pusher 71 is swingable in all directions is made between the inner walls of the support block 50 and the side walls of the pusher 71.

An elastic plate 72 having an elasticity and a surface having a high slidability, such as of silicone rubber, is adhered to the lower surface of the pusher 71. The lower surface of the elastic plate 72 is located lower than the lower surface of the frame 29 of the probe card 21. With this arrangement, the elastic plate 72 pushes the rear surface of the main region 27 so that the main region projects downward. The lower surface of the elastic plate 72 has a size sufficient to surround the entire main region 27. In other words, all of the contact elements provided in the main region 27 are situated within a plan-view contour of the elastic plate 72.

The pusher 71 has a recess portion 73 in its top side, more specifically, at the center of the rear side, and a small sphere-face recess 73a is made at the center of the recess 73. In the upper section of the recess 73 of the pusher 71, a shaft 74 made of a rigid material, for example, the same metal material as that of the support block 50 and having a high rigidity, is arranged. A ball 75 made of a material having a high hardness and abrasion resistance, such as ceramics or ruby, is pressed into the lower section of the shaft 74, and fixed therein. The tip end of the ball 75 engages with the sphere-face recess portion 73a, and thereby the pusher 71 is swingably set on the tip center of the shaft 75. That is, the pusher 71 pushes the main region 27 of the probe card 21 via the elastic plate 72 in order to impart a tension to the probe card, and also can swing around the ball 75 in all directions.

The support block 50 has a plan-view circular recess 76 in the top side thereof, more specifically, at the center of the rear side. In the recess 76, two belleville springs 77 and 78 for mounting the shaft 74 to the support block 50 and imparting an elasticity to the pusher 71 are provided. The belleville springs 77 and 78 are circular, and the center axis thereof coincides with the center axes of the support block 50, the recess 55 and the recess 76. The shaft 74 is set such that the center axis thereof is vertical and coincides with the center axes of the belleville springs 77 and 78.

The belleville springs 77 and 78 are substantially identical, and each of them is made of a thin plate of an anticorrosion material such as stainless steel. The belleville springs 77 and 78 have a plan-view contour such as shown in FIG. 5, and each has an umbrella shape with a gradual inclination from its center towards the periphery. The outer diameter of the belleville springs 77 and 78 is slightly smaller than the inner diameter of the recess 76 of the support block 50. Each of the belleville springs 77 and 78 has a center hole 79 and three openings 80 formed point-symmetrically at equiangular intervals and each substantially arcuate. The spring force of each of the belleville springs 77 and 78 is adjusted by the shape of the openings 80.

The shaft 74 is connected to the belleville springs 77 and 78 via two rings 81 and 82 provided in the recess 76 of the support block 50. The lower-side ring 81 has a female screw inside, and engages with a male screw 91 having a large diameter and formed in the lower portion of the shaft 74. The upper-side ring 82 consists of two parts 85 and 86. The part 85 is fit with the shaft 74 in a free state, and settles on the upper end of the male screw 91. The part 86 has a female screw inside, and engages with a male screw 92 having a small diameter and formed in the upper portion of the shaft 74.

As shown in FIG. 7, a hub 87 is formed at the center of the upper portion of the ring 81 on which the belleville spring 77 is mounted. The hub 87 is inserted to the hole 79 of the belleville spring 77, and the upper surface of the ring 81 which expands from the hub 87 in the radial direction, is brought into contact with the belleville spring 77. Three pins 88a (see FIG. 5) are fixed to the upper surface of the ring 81 at equiangular intervals to protrude upward therefrom. Three holes 88b are formed in the belleville spring 77 such that they have a diameter slightly smaller than that of the pins 88a and are located to correspond to the pins 88a. The belleville spring 77 and the ring 81 are fixed with each other by forcedly inserting the pins 88a into the holes 88b, respectively. The belleville spring 78 and the ring 82 are fixed to each other as the inner edge around the hole 79 is interposed between the two parts 85 and 86 of the ring 82. With this structure, the inner edges of the belleville spring 77 and 78 are arranged with an interval therebetween via the rings 81 and 82.

The outer circumferential edge of the belleville springs 77 and 78 are fixed at an interval therebetween by ring spacers 83 and 84 each having a larger diameter and mounted on the recess 76 of the support block 50. The outer edge of each of the belleville springs 77 and 78 is located lower than the inner edge of the respective spring.

The lower side spacer 83, which has a thin cylindrical shape having a bottom, is placed on the bottom surface of the recess 76 of the support block 50, and the outer side surface thereof is tightly fit with the inner circumferential wall of the recess 76. The upper surface of the lower spacer 83 is slightly lower than the upper surface of the ring 81. The outer edge of the belleville spring 77 is placed on the upper surface of the lower spacer 83, and the upper spacer 84 is placed further thereon.

The outer diameter of the upper spacer 84 is substantially the same as that of the inner diameter of the recess 76, and the outer side surface of the spacer is tightly fit with the inner circumferential wall of the recess 76 of the support block 50. The upper surface of the upper spacer 84 is leveled with the upper surface of the support block 50, and is slightly lower than the upper surface of the part 85 of the ring 82. The outer edge of the belleville spring 78 is placed on the upper surface of the upper spacer 84, and a ring cap 89 is provided further thereon. The cap 89 is fixed to the upper surface of the support block 50 via screws 93. Thus, the outer edges of the belleville springs 77 and 78 are interposed and fixed between adjacent ones of the spacers 83 and 84 and the cap 89.

An groove 94 for adjustment is formed in the upper end of the shaft 74. Since the ring 81 with the screw engages with the screw 91 of the shaft 74, the shaft 74 is rotated via the groove 94, and thus the shaft 71 can be moved up and down with respect to the ring 81. In other words, the projecting amount of the pusher 71 from the lower surface of the frame 29 can be adjusted by adjusting the rotation of the shaft 74.

Next, the operation of the probe apparatus will be described.

First, a semiconductor wafer W in a wafer cassette C is transferred by the loader stage 19 and the handling arm 12, and passed onto the work table 13 of the main stage 11. After the wafer W is fixed by the chuck 32 of the work table 13, the position of the chuck 32 is adjusted in the X, Y and θ directions, and the probe card 21 and the wafer W are aligned with each other in horizontal planes.

For example, 64 semiconductor chips are formed on one wafer W, and a main region 27 which corresponds to one semiconductor chip is provided for a probe card 21. Therefore, the position of the chuck 32 is adjusted in the X, Y and θ directions, and the main region 27 of the probe card 21 and one of the semiconductor chips of the wafer W are aligned with each other.

Next, the work table 13 is moved in the Z direction, that is, elevated, so that electrode pads EP of the semiconductor chip are brought into contact with the contact elements 28 provided in the main region 27 of the probe card 21. At this moment, the semiconductor wafer W is brought into contact with the probe card 21 while pushing the pusher 71 in the vertical direction in spite of the spring force of the belleville springs 77 and 78.

Generally, chips, i.e. to-be-examined portion, of a wafer W are brought into contact with the main region 27 of the probe card 21 horizontally, that is, in parallel with the main region 27. Even though the electric pads EP of the wafer differ from each other in height, the elastic plate is capable of bringing the electrode pads EP into contact with the respective contact elements 28 of the probe card 21 absorbing the height differences. If the distance between adjacent electrode pads EP is narrow as 100 μm or less, the contact elements 28, unlike the probes, are not deformed frontward, backward, leftward or rightward, but are stable, thereby enabling an accurate examination.

On the other hand, for example, in the case where the to-be-examined section of the wafer W is inclined with the left side up, for some reason, those of the electrode pads EP, located on the left side are brought into contact with those of the contact elements 28, located on the left side of the main region 27, as the probe card 21 making contact with the wafer W. Further, when the wafer W is elevated, a pressure is applied to the left side of the pusher 71 via the probe card 21. Consequently, the pusher 71 is rotated in the clockwise direction around the ball 75 so as to align the main region 27 with respect to the inclination of the wafer W. At this time, the pusher 71 is rotated such that the elastic plate 72 adhered to the lower side of the pusher slides on the rear side of the main region 27. Thus, regardless of which direction the wafer W is inclined, the pusher 71 is inclined as it slides on the rear side of the main region 27, in accordance with the inclination of the wafer; therefore the contact elements 28 of the main region 27 are surely brought into contact with the electrode pads EP of the wafer w.

When the probe card 21 is brought into contact with the wafer W, the work table 13 is excessively driven so that the wafer W pushes up the pusher 71 in spite of the urging force of the belleville springs 77 and 78. If the to-be-examined section of the wafer W is inclined, the pusher 71 is elevated while maintaining the inclined state, whereas the shaft 74 is elevated as it is vertically supported by the belleville springs 77 and 78. Consequently, the up and down movement of the shaft 74 is stabilized, enabling to apply the spring force of a constant direction to the pusher 71 at all times. Since the shaft 74 is engaged with the ring 81, the pushing out amount of the pusher 71 is adjusted by the rotation of the shaft 74. Therefore, the height position of the main region 27 can be varied in accordance with the mode of the examination.

In the embodiment, the main region 27 of the probe card 21 is formed so as to correspond to one of, for example, 64 semiconductor chips provided in a semi-conductor wafer w. However, the main region 27 may be formed so that a number of semiconductor chips can be measured at once, or all of, for example, 64 semi-conductor chips can be measured at once. Further, the number of belleville springs used for supporting the shaft 74 is not limited to two, but it may be one or three or more. Furthermore, in order to arrange the pusher 71 swingably on the lower end of the shaft 74, a joint of the pogo-pin structure may be employed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probe apparatus for examining an electrical characteristic of an object having a number of electrode pads, comprising:

a work table having a table surface on which said object is placed;

a wiring board provided above said work table, said wiring board comprising a substrate supported by a framework of said probe apparatus and having a high rigidity, and board wiring provided on said substrate and electrically connected to a tester;

a probe card supported by said wiring board, said probe card comprising a flexible and insulating membrane, and flexible card wiring formed on said membrane and electrically connected to said board wiring of said wiring board, said probe card having a main region, in which a plurality of contact elements to be respectively brought into contact with said electrode pads of said object are arranged on a front side opposing to said table surface, and said contact elements being electrically connected to said card wiring;

mounting means for mounting said probe card on said wiring board;

a pusher brought into contact with a rear side of said main region of said probe card, said pusher having a contact surface set such that all of said contact elements are located within a contour thereof, a shaft engaging with said pusher so as to arrange said pusher swingably on a rear side of said main region of said probe card, said shaft having a center axis which is substantially normal to said table surface;

first and second belleville springs connected to said shaft so as to apply an urging force to the main region of said probe card, and to said contact surface of said pusher, said first and second belleville springs being arranged substantially in parellel with said table surface and separated from each other along the center axis of said shaft; and securing means, mounted on said wiring board, for securing said first and second belleville springs.

2. An apparatus according to claim 1, wherein said pusher comprises a main body engaging with said shaft and having a high rigidity, and an elastic plate made of an elastic material attached to said main body, and said contact surface is formed of said elastic plate.

3. An apparatus according to claim 1, wherein said pusher and said shaft are brought into contact with each other via a projecting spherical surface and a recess for receiving the spherical surface, formed respectively on said pusher and shaft.

4. An apparatus according to claim 1, wherein said shaft is supported by said first and second belleville springs via a screw mechanism, and the relative position of said shaft with respect to said first and second belleville springs is adjustable along the center axis of said shaft by the operation of said screw mechanism.

5. An apparatus according to claim 1, further comprising a frame having a high rigidity and attached to the rear side of said probe card so as to surround said main region of said probe card, wherein said frame has a flat surface for imparting a flatness to a section of said probe card surrounded by said frame and including said main region, and said pusher pushes said main region of said probe card further from said flat surface of said frame towards said table surface.

6. An apparatus according to claim 5, further comprising a positioning surface for positioning said frame with respect to said wiring board such that said flat surface of said frame is substantially in parallel with said table surface.

7. An apparatus according to claim 6, wherein said mounting means includes a member for detachably fixing said frame to said positioning surface.

8. An apparatus according to claim 1, wherein said securing means comprises a member which fixes outer circumferential edges of said first and second belleville springs with respect to said wiring board.

9. A probe apparatus for examining an electrical characteristic of an object having a number of electrode pads, comprising:

a work table having a table surface on which said object is placed;

a wiring board provided above said work table, said wiring board comprising a substrate supported by a framework of said probe apparatus and having a high rigidity, and board wiring provided on said substrate and electrically connected to a tester;

a support block supported by said wiring board, said support block having a recess arranged such as to oppose said table surface;

first mounting means for mounting said support block to said wiring board;

a probe card supported by said support block, said probe card comprising a flexible and insulating membrane, and flexible card wiring formed on said membrane and electrically connected to said board wiring of said wiring board, said probe card having a main region, in which a plurality of contact elements to be respectively brought into contact with said electrode pads of said object are arranged on a front side opposing to said table surface, said contact elements being electrically connected to said card wiring, and said main region being located so as to cover said recess of said support block;

second mounting means for mounting said probe card on said support block;

a pusher arranged in said recess of said support block so as to be brought into contact with a rear side of said main region of said probe card, said pusher having a contact surface set such that all of said contact elements are located within a contour thereof, a shaft engaging with said pusher so as to arrange said pusher swingably on a rear side of said main region of said probe card, said shaft having a center axis which is substantially normal to said table surface;

first and second belleville springs connected to said shaft so as to apply an urging force to the main region of said probe card, to said contact surface of said pusher, said first and second belleville springs being arranged substantially in parallel with said table surface and separated from each other along the center axis of said shaft; and means, mounted on said support block, for securing said first and second belleville springs.

10. An apparatus according to claim 9, wherein said wiring board has an opening, and said support block is arranged such that it projects through the opening towards said table surface.

11. An apparatus according to claim 9, wherein said pusher comprises a main body engaging with said shaft and having a high rigidity, and an elastic plate made of an elastic material attached to said main body, and said contact surface is formed of said elastic plate.

12. An apparatus according to claim 9, wherein said pusher and said shaft are brought into contact with each other via a projecting spherical surface and a recess for receiving the spherical surface, formed respectively on said pusher and shaft.

13. An apparatus according to claim 9, wherein said shaft is supported by said first and second belleville springs via a screw mechanism, and the relative position of said shaft with respect to said first and second belleville springs is adjustable along the center axis of said shaft by the operation of said screw mechanism.

14. An apparatus according to claim 9, further comprising a frame having a high rigidity and attached to the rear side of said probe card so as to surround said main region of said probe card, wherein said frame has a flat surface for imparting a flatness to a section of said probe card surrounded by said frame and including said main region, and said pusher pushes said main region of said probe card further from said flat surface of said frame towards said table surface.

15. An apparatus according to claim 14, wherein said support block further comprises a positioning surface for positioning said frame with respect to said support block such that said flat surface of said frame is substantially in parallel with said table surface.

16. An apparatus according to claim 15, wherein said second mounting means includes a member for detachably fixing said frame on said positioning surface.

17. An apparatus according to claim 9, wherein said securing means comprises a member which fixes outer circumferential edges of said first and second belleville springs with respect to said support block.

* * * * *